United States Patent [19]

Perkins et al.

[11] Patent Number: 5,093,585
[45] Date of Patent: Mar. 3, 1992

[54] CURRENT BIASING FOR I²L CIRCUITS

[75] Inventors: Geoffrey W. Perkins, Chandler; Don W. Zobel, Miami; Tony Takeshian, Chandler, all of Ariz.

[73] Assignee: Motorola, Inc., Schaumburg, Ill.

[21] Appl. No.: 674,477

[22] Filed: Mar. 25, 1991

[51] Int. Cl.⁵ .................. H03K 3/01; H03K 19/091
[52] U.S. Cl. ............................ 307/296.1; 307/477; 307/296.6
[58] Field of Search ............ 307/440, 466, 477, 296.1, 307/296.6, 296.7, 296.8

[56] References Cited

U.S. PATENT DOCUMENTS 4,593,206  6/1986  Neidorff et al. ............... 307/296.1

*Primary Examiner*—David Mis
*Attorney, Agent, or Firm*—Michael D. Bingham

[57] ABSTRACT

A negative feedback loop, including a two collector I²L gate having one collector returned to the input of the gate and forcing a reference current into the other of the two collectors of the gate, is used to match the current at the collector of the injector of the gate to the reference current. The feedback loop further includes a current source for sourcing the reference current and a pair of cascoded emitter follower transistors coupled between the current source and the injector input of the gate such that the feedback loop will regulate the current through the injector to be equal to the reference current. The injector input of the gate of the feedback loop can be coupled to the injector inputs of similar I²L gates to be biased therefrom such that the injector currents are well controlled.

8 Claims, 1 Drawing Sheet

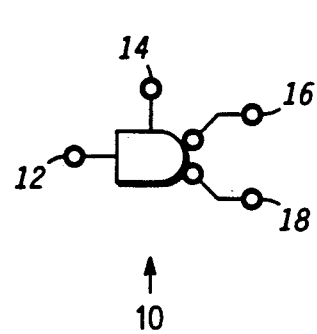
FIG. 1
-PRIOR ART-
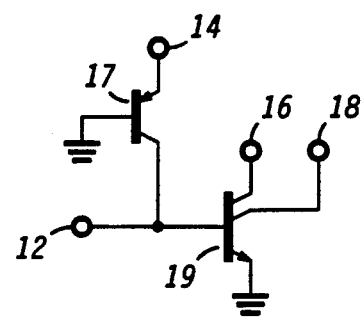
FIG. 2
-PRIOR ART-
FIG. 3
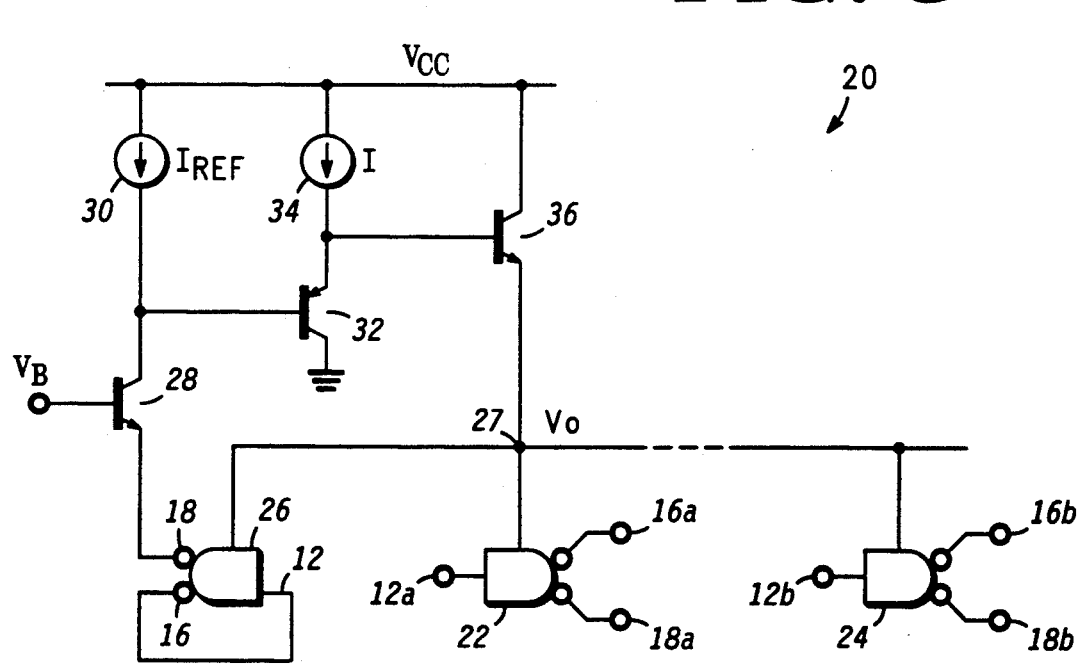

CURRENT BIASING FOR I²L CIRCUITS

BACKGROUND OF THE INVENTION

The present invention relates to improved current biasing of integrated injection logic (I²L) circuits.

I²L circuits are formed in an integrated circuit and comprise an inverted npn transistor structure having multiple open collectors and an pnp injector, as is well known. The collector of the pnp injector is formed in common with the base input of the npn transistor while its base is common to the emitter of the latter. Biasing of the I²L circuit is normally achieved by connecting a resistor from the emitter of the injector to a positive voltage. This technique though very simple, has the drawback that the hole efficiency of the injector alpha determines the amount current sourced from the injector to the base of the inverted npn transistor. This current then directly effects the charging of the input node (base of the npn transistor) of the I²L circuit and is dependent on process variations in the manufacturing of the integrated circuit. Hence, the speed of operation of the I²L circuit will vary with process tolerances in production of such circuits. This is undesirable in that the circuit can fail circuit specifications which reduces yield of production parts incorporating such I²L circuits.

Thus, there is a need for an improved biasing arrangement for use in I²L circuits for minimizing the effects of injector alpha on the speed of the circuit due to integrated circuit fabrication process tolerances.

SUMMARY OF THE INVENTION

In accordance with the above there is provided a current bias arrangement comprising a negative feedback loop for matching the collector current of the injector transistor of a I²L circuit to a reference current wherein the reference current is sourced to a first collector of a two-collector I²L gate comprising the feedback loop while the second collector thereof is connected to the input of the gate, the feedback loop also includes circuitry coupled between the first collector and the injector input of the I²L gate which regulates the current through the injector of the gate and the output of the bias arrangement is then taken at the injector input to drive the injector inputs of multiple I²L circuits coupled thereto.

BRIEF DESCRIPTION OF THE DRAWING

FIGS. 1 and 2 are prior art logic and schematic diagrams respectively of a conventional I²L gate; and FIG. 3 is a schematic diagram of an embodiment of the current biasing arrangement of the present invention.

DETAILED DESCRIPTION OF THE PREFERRED EMBODIMENT

Referring to FIGS. 1 and 2 there is shown a conventional I²L gate 10 including input 12, injector node 14 and multiple outputs 16 and 18. As known, the I²L gate is formed in an integrated circuit wherein the n-epitaxial region forms both the emitter of npn transistor 19 and the base of pnp injector transistor 17 which are coupled to a common potential in operation. The base of npn transistor 19 is formed by p-type material diffused into the epitaxial region which also comprises the collector of injector 17 both of which are coupled to input 12. Multiple collector outputs are then formed of multiple n-type material regions diffused into the base region of transistor 19. Transistor 19 is shown as having at least two such collectors coupled to terminals 16 and 18 although additional collectors could be realized. The emitter of injector 17 is separately deposited in the epitaxial region of the integrated circuit and consists of a p-type material that is coupled to injector bias node 14. Transistor 19 is schematically shown and referred to as an inverted transistor. This refers to the fact that the collectors of transistor 19 in the I²L configuration correspond to the emitters of a standard vertical npn transistor while the emitter of the former corresponds to the collector of the latter. The foregoing structure of I²L gate 10 is well known and is not novel.

Typically, injection node 14 is coupled in operation to a positive operating potential via a resistor (not shown) while the base of the injector and emitter of transistor 19 are coupled to a common or ground potential. Thus, a positive input signal at input 12 turns on transistor 19 which is supplied base current drive from injector 17. The potential at outputs 16 and 18 will go to a logic zero as transistor 19 is turned on and will go to a logic one as input 12 goes to a logic zero.

As previously mentioned, the gain of injector 17 varies widely with manufacturing process tolerances found in today's integrated circuit fabrication techniques. As the gain of the injector varies the amount of base current supplied from the collector thereof is not controlled which effects the charging of the node coupled to input 12. Hence, the speed of operation of the I²L gate is affected. The present invention provides a bias circuit and method for controlling the current at the collector of the injector in order to have a well defined injector current thereby making the gate delay (speed) independent of the injector transistor.

Turning now to FIG. 3 the current bias circuit 20 of the present invention will be described. Bias circuit 20 is utilized to provide a known and predetermined injector current to I²L circuits such as I²L gates 22 and 24 of the type as illustrated in FIGS. 1 and 2. The I²L injector bias circuit of the present invention minimizes the effects of injector alpha on speed and comprises a negative feedback loop to match the current at the collector of the injector to a well controlled reference current as will now be explained.

Bias circuit 20 includes a two-collector I²L gate 26 the structure of which is shown in FIG. 2. One of the collector outputs, either 16 or 18 is connected to the input 12. Gate 20, in combination with the circuitry coupled between the other collector output and the injector input node 27 comprises a negative feedback loop that is used to match the current at the collector of the pnp injector to a controlled reference current. Thus, the collector of gate 26 that is not returned to the input of the gate is coupled to the emitter of npn transistor 28, the base of which is biased by a potential $V_B$. The collector of transistor 28 is coupled to current source 30 the latter of which is returned to a first power supply conductor to which is supplied $V_{CC}$. Current source 30 supplies the controlled reference current that is the desired injector current. Pnp transistor 32 has its base coupled to the collector of transistor 28, its collector coupled to a second power supply conductor to which is applied ground reference and an emitter coupled to current source 34. Current source 34 being coupled to $V_{CC}$ provides a current sufficient to supply base current drive to the base of npn transistor 36 and transistor 32.

The collector of transistor 36 is returned to $V_{CC}$ while its emitter is coupled to output node 27; the injector input nodes for I²L gates 22, 24 and 26.

In operation, $V_B$ is of sufficient magnitude, i.e., at least two base-to-emitter voltage drops, to prevent the inverted transistor 19 of gate 26 from becoming saturated and breaking down from excessive reverse bias on collector 18. Hence, the predetermined and desired current $I_{REF}$ is sourced through the collector-emitter path of transistor 28 into the collector (18) of gate 26 coupled thereto. This forces the base-to-emitter voltage of transistor 19 to a resulting value. By connecting the other collector (16) of transistor 19 back to its base (the input of gate 26) a current mirror is produced such that this collector wants to sink the same magnitude of current as is forced into the other collector of the gate. Therefore, the injector current sourced from injector 17 of the gate 26 to the base of transistor 19 thereof is forced to be substantially the known current $I_{REF}$. The feedback loop will regulate the current in the collector coupled to terminal 16 until the injector current is matched to the reference current. In a regulated state, the voltage $V_O$ is set and is such that if node 27 is coupled to the injector input node 14 of additional I²L gates 22 and 24 then the base-to-emitter voltage drop of the injector transistors of these gates should be equal to that of the injector of gate 26. This will result in substantially the same injector current in all the gates with each being equal to $I_{REF}$.

Hence, by using a two-collector I²L gate in a negative feedback loop, wherein one collector is coupled to the input of the gate and driving circuitry is coupled between the other collector of the gate and the injector input thereof, the injector current can be matched to a known reference current that is forced into the other collector of the gate. The resulting circuit can be used to bias I²L circuits having their injector inputs coupled to the injector input of the two-collector gate of the bias circuit.

What is claimed is:

1. An integrated bias circuit for providing current biasing of I²L circuits coupled to an output of the bias circuit, comprising:

an I²L gate including a npn transistor having at least first and second collector regions, an emitter region and a base region, and a pnp injector having a collector formed in common with said base region, a base formed in common with said emitter region and an emitter;

means for coupling said first collector region to the base region of said npn transistor; and circuit means having first and second terminals coupled respectively between the second collector region and said emitter of said pnp injector, said circuit means providing negative feedback to said I²L gate for matching the current sourced from said collector of said pnp injector to a predetermined current supplied from said first terminal of said circuit means into said second collector region of said I²L gate while producing a regulated voltage at said second terminal, said second terminal being coupled to the output of the bias circuit.

2. The bias circuit of claim 1 wherein said circuit means includes:

a first current source for supplying said predetermined current;

a first npn transistor having an emitter coupled to said first terminal, a base, and a collector coupled to said first current source;

means for biasing said base of said first npn transistor to a reference bias potential;

a second npn transistor having an emitter coupled to said second terminal, a collector coupled to a power supply conductor and a base;

a pnp transistor having an emitter coupled to said base of said second npn transistor, a base coupled to said collector of said first npn transistor and a collector coupled to a second power supply conductor; and a second current source for supplying a substantially constant current at an output, said output being coupled to said emitter of said pnp transistor.

3. An integrated current bias circuit for providing a predetermined injector bias current to the injector input of an I²L gate, comprising:

an inverted npn transistor having first and second collectors, a base and an emitter, said emitter being coupled to a first power supply conductor;

a pnp injector having a collector coupled to said base of said inverted npn transistor, a base coupled to said first power supply conductor, and an emitter;

means for coupling said first collector of said inverted npn transistor to said base thereof;

circuit means coupled between said second collector of said inverted npn transistor and said emitter of said pnp injector for supplying a predetermined current to said second collector which is substantially mirrored through said pnp injector; and means for coupling the emitter of said pnp injector to the injector input of the I²L gate.

4. The current bias circuit of claim 3 wherein said circuit means includes:

a first current source for supplying a substantially constant current at an output, said output being coupled to said second collector of said inverted npn transistor;

a pnp transistor having a base coupled to said output of said first current source, an emitter and a collector coupled to said first power supply conductor;

a second current source having an output coupled to said emitter of said pnp transistor; and a first npn transistor having a base coupled to said emitter of said pnp transistor, an emitter coupled to said emitter of said pnp injector and a collector coupled to a second power supply conductor.

5. The current bias circuit of claim 4 wherein said circuit means includes a second npn transistor having a base, emitter and collector, said base being biased at a predetermined potential, said emitter being coupled to said second collector of said inverted npn transistor and said collector being coupled to said output of said first current source.

6. A method for matching the injector current of an I²L gate to a predetermined current wherein the gate includes an inverted npn transistor having at least two collectors, a base, and an emitter, and a pnp injector transistor having a collector formed in common with the base of the npn transistor, a base formed in common with the emitter of the npn transistor and an emitter, comprising the steps of:

providing means for coupling one of the two collectors of the npn transistor to the base thereof;

sourcing the predetermined current to the other one of the two collectors of the npn transistor; and providing a feedback loop between the other one of the two collectors of the npn transistor and the emitter of the injector transostor for matching the current flow through the emitter-collector conduction path of the injector transistor to the predetermined current.

7. An I²L circuit including an injector transistor to which a current is sourced and an inverted multi-collector npn transistor, the base of the multi-collector transistor being the input of the I²L circuit and the individual ones of the multi-collectors being the outputs of the I²L circuit, the improvement comprising a current bias circuit for matching the current sourced to the injector transistor to a predetermined current, the current bias circuit including a current source for providing the predetermined current and a feedback loop, said feedback loop including and I²L circuit having a two collector inverted npn transistor with a first collector thereof being coupled to the base of the npn transistor; a pnp injector transistor having a collector and emitter formed respectively in common with the base and emitter of the npn transistor of said feedback loop, the second collector of the npn transistor being coupled to said current source; and circuit means coupled between said current source and said emitter of said injector transistor of said feedback loop wherein said feedback loop provides negative feedback for matching the current through said injector transistor to said current sourced from said current source to said second collector, said emitter of said injector transistor of said feedback loop being coupled the injector transistor of the I²L circuit.

8. The I²L circuit of claim 7 wherein said circuit means of said feedback loop includes:
   a pnp transistor having a base coupled to said said current source, an emitter and a collector coupled to a first power supply conductor;
   a second current source having an output coupled to said emitter of said pnp transistor; and
   a first npn transistor having a base coupled to said emitter of said pnp transistor, an emitter coupled to said emitter of said injector transistor of said feedback loop and a collector coupled to a second power supply conductor.

* * * * *